United States Patent
Tarman et al.

(10) Patent No.: US 10,089,424 B2
(45) Date of Patent: Oct. 2, 2018

(54) SYSTEMS AND METHODS FOR TWO-DIMENSIONAL DOMAIN DECOMPOSITION DURING PARALLEL RESERVOIR SIMULATION

(75) Inventors: Mehmet Tarman, Houston, TX (US); Graham Christopher Fleming, Houston, TX (US); Dominic Camilleri, Houston, TX (US); Kefei Wang, Katy, TX (US)

(73) Assignee: Landmark Graphics Corporation, Houston, TX (US)

(*) Notice: Subject to any disclaimer, the term of this patent is extended or adjusted under 35 U.S.C. 154(b) by 1038 days.

(21) Appl. No.: 13/995,081

(22) PCT Filed: Dec. 16, 2010

(86) PCT No.: PCT/US2010/060836
§ 371 (c)(1),
(2), (4) Date: Sep. 25, 2013

(87) PCT Pub. No.: WO2012/082128
PCT Pub. Date: Jun. 21, 2012

(65) Prior Publication Data
US 2014/0012557 A1 Jan. 9, 2014

(51) Int. Cl.
*G01V 11/00* (2006.01)
*G06F 17/50* (2006.01)
*G01V 99/00* (2009.01)

(52) U.S. Cl.
CPC .......... *G06F 17/5018* (2013.01); *G01V 11/00* (2013.01); *G01V 99/005* (2013.01); *G01V 2210/66* (2013.01)

(58) Field of Classification Search
CPC .... G06F 17/5018; G01V 11/00; G01V 99/005
See application file for complete search history.

(56) References Cited

U.S. PATENT DOCUMENTS

| 4,463,096 | A | 7/1984 | Hughes |
| 7,716,029 | B2 * | 5/2010 | Couet ................ G01V 11/00 703/10 |
| 8,386,227 | B2 * | 2/2013 | Fung ................ G06F 17/5018 703/10 |
| 8,433,551 | B2 * | 4/2013 | Fung ................ G01V 99/005 703/10 |
| 9,594,186 | B2 * | 3/2017 | Maliassov .......... G01V 99/00 |
| 2006/0235667 | A1 | 10/2006 | Fung et al. |
| 2008/0177511 | A1 | 7/2008 | Kamatsuchi |
| 2010/0114544 | A1 | 5/2010 | Dogru |
| 2010/0286971 | A1 | 11/2010 | Middya et al. |

OTHER PUBLICATIONS

Kirk Schloegel, George Karypis & Vipin Kumar "Parallel Static and Dynamic Multi-Constraint Graph Partitioning" Concurrency & Computation: Practice & Experience, vol. 14, pp. 21-240 (2002).*

(Continued)

*Primary Examiner* — Jay Hann
(74) *Attorney, Agent, or Firm* — Kilpatrick Townsend & Stockton LLP

(57) ABSTRACT

Systems and methods for 2D domain decomposition during parallel reservoir simulation to balance the active cells in a reservoir model.

20 Claims, 11 Drawing Sheets
(3 of 11 Drawing Sheet(s) Filed in Color)

(56) References Cited

OTHER PUBLICATIONS

Ali H. Dogru, et al. "A Next-Generation Parallel Reservoir Simulator for Giant Reservoirs" SPE 119272 (2009).*

Kirk Schloegel, George Karypis & Vipin Kumar "Graph Partitioning for High Performance Scientific Simulations" CRPC Parallel Computing Handbook (2000).*

Fiduccia, C.M. & Mattheyses, R.M. "Linear-Time Heuristic for Improving Network Partitions" IEEE 19th Design Automation Conf., pp. 175-181 (1982).*

Farhat, C. & Lesoinne, M. "Automatic Partitioning of Unstructured Meshes for the Parallel Solution of Problems in Computational Mechanics" Int'l J. Numerical Methods in Engineering, vol. 36, pp. 745-764 (1993) (Year: 1993).*

Lee W. Young; International Search Report & Written Opinion; PCT/US2010/60836; dated Feb. 9, 2011; 8 pgs; ISA/US, Alexandria, Virginia.

Omar F. Fernandez Rivas; International Preliminary Report on Patentability; PCT/US2010/60836; dated Jan. 15, 2013; 23 pgs.; IPEA/US, Alexandria, Virginia.

Chirag Mehta; Patent Examination Report No. 1 for Australian Patent Application No. 2010365385; dated Jan. 6, 2015; 3 pgs.; Australian Government—IP Australia.

Andres Eduardo Mantilla; Predicting Petrophysical Properties by Simultaneous Inversion of Seismic and Resevior Engineering Data; PhD dissertation; Stanford University; Nov. 2002; 219 pgs.

Response to Patent Examination Report No. 1 for Australian Patent Application No. 2010365385; dated Jan. 22, 2015; 30 pgs.; Callinans.

David Green; Examiner's Letter for Canadian Patent Application No. 2,821,482; dated Oct. 16, 2014; 2 pgs.; Canadian Property Office Intellectual.

Response to Examiner's Letter for Canadian Patent Application No. 2,821,482; dated Mar. 9, 2015; 10 pgs.; Parlee Mclaws.

Xue Liu; First Office Action for Chinese Patent Application No. 201080071227.5; dated Jun. 1, 2015; 4 pgs.; The State Intellectual Property Office of the People's Republic of China.

Official Action for Mexican Patent Application No. Mx/a/2013/006937; dated Sep. 11, 2015; 5 pgs.; Mexican Patent Office.

Javier, Francisco; Response to Office Action; dated Oct. 22, 2015; 6 pages; Mexican Patent Appiication No. MX/a/2013/006937; Uhthoff and Orive; Mexico.

Komarov, A.M.; Second Office Action; dated Sep. 24, 2015; 3 pages; Patent Application No. 201390853/31; The Eurasian Patent Office; Moscow, Russia.

Khmara, M.V.; Response; dated Feb. 3, 2016; 14 pages; Eurasian Patent Application No. 201390853/31; ARS—Patent; Saint Petersburg, Russia.

* cited by examiner

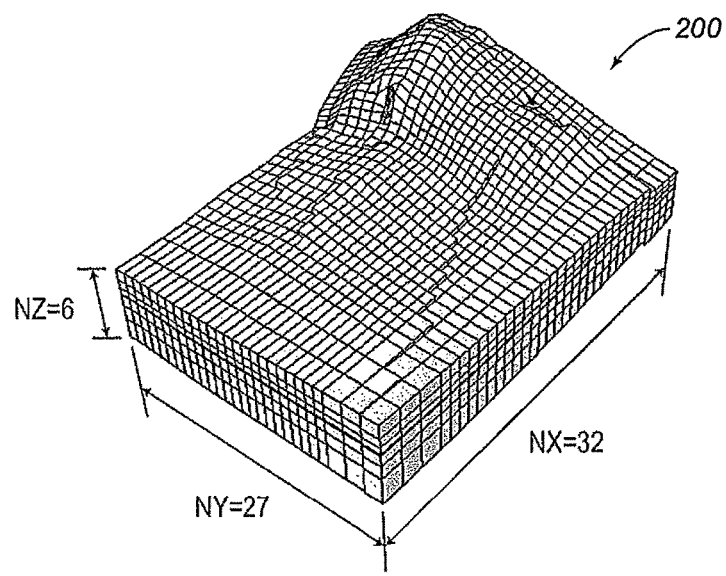
FIG. 2
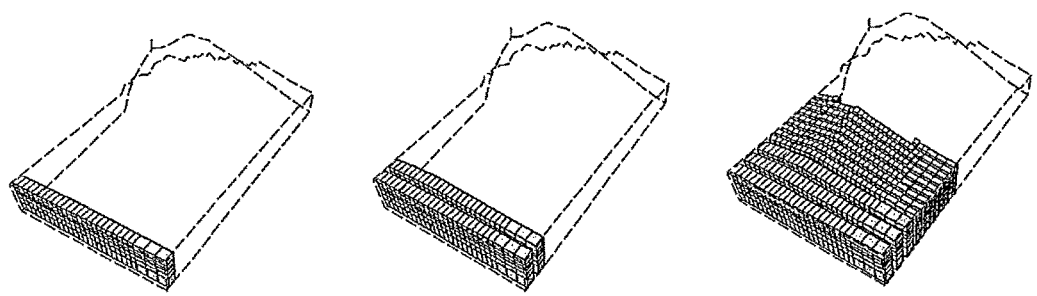
162 active cells at $X_1$
FIG. 3A
320 active cells at $X_2$
FIG. 3B
1780 active cells at $X_{11}$
FIG. 3C 159 active cells at $X_{11}$ 310 active cells at $X_{12}$ 1779 active cells at $X_{21}$ 60 active cells at $Y_{1,1}$ 780 active cells at $Y_{13,1}$ 839 active cells at $Y_{14,1}$

SYSTEMS AND METHODS FOR TWO-DIMENSIONAL DOMAIN DECOMPOSITION DURING PARALLEL RESERVOIR SIMULATION

CROSS-REFERENCES TO RELATED APPLICATIONS

The priority of PCT Patent Application No. PCT/US2010/60836, filed on Dec. 16, 2010, is hereby claimed, and the specification thereof is incorporated herein by reference.

STATEMENT REGARDING FEDERALLY SPONSORED RESEARCH

Not applicable

FIELD OF THE INVENTION

The present invention generally relates to two-dimensional (2D) domain decomposition during parallel reservoir simulation. More particularly, the present invention relates to systems and methods for 2D domain decomposition during parallel reservoir simulation to balance the active cells in a reservoir model.

BACKGROUND OF THE INVENTION

Many types of physical processes, including fluid flow in a petroleum reservoir, are governed by partial differential equations. These partial differential equations, which can be very complex, are often solved using finite difference, finite volume, or finite element methods. All of these methods divide the physical model into units called gridblocks, cells, or elements. In each of these physical units the solution is given by one or more solution variables or unknowns. Associated with each physical unit is a set of equations governing the behavior of these unknowns, with the number of equations being equal to the number of unknowns. These equations also contain unknowns from neighboring physical units.

Thus, there is a structure to the equations, with the equations for a given physical unit containing unknowns from that physical unit and from its neighbors. This is more conveniently depicted using a combination of nodes and connections, where a node is depicted by a small circle and a connection is depicted by a line between two nodes. The equations at a node contain the unknowns at that node and at the neighboring nodes to which it is connected.

The equations at all nodes are assembled into a single matrix equation. Often the critical task in obtaining the desired solution to the partial differential equation is solving this matrix equation. One of the most effective ways to do this is through the use of incomplete LU factorization or ILU, in which the original matrix is approximately decomposed to the product of two matrices L and U. The matrices L and U are lower triangular and upper triangular and have similar non-zero structures as the lower and upper parts of the original matrix, respectively. With this decomposition, the solution is obtained iteratively by forward and backward substitutions.

There is an ongoing need to obtain better solution accuracy. One way to do this is to divide the physical model into smaller physical units, or in other words to use more nodes, perhaps millions of them. Of course, the time needed to perform the computations increases as this is done. One way to avoid this time increase is to perform the computations in parallel on multiple processors.

There are two types of parallel computers, those using shared memory and those using distributed memory. Shared memory computers use only a handful of processors, which limits the potential reduction in run time. Distributed memory computers using tens of processors are common, while some exist that use thousands of processors. It is desired to use distributed memory parallel processing. In either case, the number of processors is typically an even number in parallel computing.

When using distributed memory, the computations are parallelized by decomposing the physical model into domains, with the number of domains being equal to the number of processors to be used simultaneously. Each domain is assigned to a particular processor, which performs the computations associated with that domain. Each domain contains a specified set of nodes, and each node is placed in a domain.

There are at least two main factors affecting the parallel simulator performance when decomposing the domain for a given reservoir model: the number of active simulation cells in each decomposed domain and grid coloring. The challenge is keeping the number of active simulation cells balanced while not causing grid coloring issues. An active cell represents a unitary space in the reservoir model with oil, gas and/or water. An inactive cell therefore, represents a unitary space in the reservoir model without oil, gas and/or water.

Conventional applications like Nexus®, which is a commercial software application offered by Landmark Graphics Corporation, do not take the number of active cells into account during 2D domain decomposition and typically divide the reservoir model into equal parts between the domains, regardless of the number of active simulation cells in each domain. In this approach, depending on the reservoir geometry, domains might end up getting a very disproportionate number of active cells causing poor reservoir simulation performance.

Parallelism in Nexus® is based upon a domain-decomposition approach; the entire model is subdivided or decomposed into collections of cells called grids. When Nexus® is run in parallel, a group of Nexus® processes is started with a specified number of processes, and each of the grids is assigned to one of these processes. The assignment can be specified by the user, or it can be determined by Nexus®. Each process performs the model computations upon the grids which were assigned to it. Some of these computations require data from grids assigned to other processes when a cell has one or more of its immediately adjacent neighbors.

The performance of Nexus®, when run in parallel, is affected significantly by the decomposition of the reservoir model cells into grids and the manner in which the grids are assigned to processes. Because the reservoir model grids are coupled through a pressure equation, data from adjacent grids affects the solution within a grid. Several times within every timestep, information needs to be passed from each grid to all grids physically connected to it. The assignment of grids to processes must account for the physical connections between cells in the model—this is one reason why a typical decomposition often looks like a collection of building blocks: the inter-grid communications are minimized.

SUMMARY OF THE INVENTION

The present invention therefore, meets the above needs and overcomes one or more deficiencies in the prior art by providing systems and methods for 2D domain decomposition during parallel reservoir simulation to balance the active cells in a reservoir model.

In one embodiment, the present invention includes a method for 2D domain decomposition during parallel reservoir simulation comprising: a) calculating each combination for a predetermined number of decomposition domains in a reservoir model using a computer processor; b) identifying a number of decomposition domains in an X direction and a number of decomposition domains in a Y direction for one of the combinations; c) calculating one or more decomposition boundaries in a predetermined order for the number of decomposition domains in the X direction and the number of decomposition domains in the Y direction, the predetermined number of decomposition domains being separated by the decomposition boundaries calculated in the predetermined order and assigned a respective actual number of active cells; d) calculating an offset size based on an ideal number of active cells for each of the predetermined number of decomposition domains and the actual number of active cells; e) calculating one or more decomposition boundaries in another predetermined order for the number of decomposition domains in the X direction and the number of decomposition domains in the Y direction, the predetermined number of decomposition domains being separated by the decomposition boundaries calculated in the another predetermined order and assigned a respective another actual number of active cells; f) calculating another offset size based on the ideal number of active cells for each of the predetermined number of decomposition domains and the another actual number of active cells; g) repeating steps b)-f) for each combination calculated in step a), each combination represented by the offset size and the another offset size; and h) selecting one of the combinations with a lowest one of the offset size and the another offset size, the combination with the lowest one of the offset size and the another offset size including the decomposition boundaries calculated in the predetermined direction or the another predetermined direction.

In another embodiment, the present invention includes a method for 2D domain decomposition during parallel reservoir simulation comprising: a) calculating each combination for a predetermined number of decomposition domains in a reservoir model using a computer processor; b) identifying a number of decomposition domains in an X direction and a number of decomposition domains in a Y direction for one of the combinations; c) calculating one or more decomposition boundaries in a predetermined order for the number of decomposition domains in the X direction and the number of decomposition domains in the Y direction, the predetermined number of decomposition domains being separated by the one or more decomposition boundaries calculated in the predetermined order and assigned a respective actual number of active cells; d) calculating an offset size based on an ideal number of active cells for each of the predetermined number of decomposition domains and the actual number of active cells; e) calculating one or more decomposition boundaries in another predetermined order for the number of decomposition domains in the X direction and the number of decomposition domains in the Y direction, the predetermined number of decomposition domains being separated by the one or more decomposition boundaries calculated in the another predetermined order and assigned a respective another actual number of active cells; f) calculating another offset size based on the ideal number of active cells for each of the predetermined number of decomposition domains and the another actual number of active cells; g) moving the one or more decomposition boundaries calculated in the predetermined order or the one or more decomposition boundaries calculated in the another predetermined order by stair-stepping to produce one or more new decomposition boundaries calculated in the predetermined order or one or more new decomposition boundaries calculated in the another predetermined order, the predetermined number of decomposition domains being separated by the one or more new decomposition boundaries calculated in the predetermined order or the one or more new decomposition boundaries calculated in the another predetermined order and assigned a respective new actual number of active cells or a respective another new actual number of active cells; h) calculating a final offset size based on the ideal number of active cells for each of the predetermined number of decomposition domains and the new actual number of active cells or the another new actual number of active cells; i) repeating steps (b)-(h) for each combination calculated in step (a), each combination represented by the final offset size; and j) selecting one of the combinations with a lowest final offset size, the combination with the lowest final offset size including the one or more new decomposition boundaries calculated in the predetermined direction or the one or more new decomposition boundaries calculated in the another predetermined direction.

In yet another embodiment, the present invention includes a non-transitory program carrier device tangibly carrying computer executable instructions for 2D domain decomposition during parallel reservoir simulation. The instructions are executable to implement: a) calculating each combination for a predetermined number of decomposition domains in a reservoir model; b) identifying a number of decomposition domains in an X direction and a number of decomposition domains in a Y direction for one of the combinations; c) calculating one or more decomposition boundaries in a predetermined order for the number of decomposition domains in the X direction and the number of decomposition domains in the Y direction, the predetermined number of decomposition domains being separated by the decomposition boundaries calculated in the predetermined order and assigned a respective actual number of active cells; d) calculating an offset size based on an ideal number of active cells for each of the predetermined number of decomposition domains and the actual number of active cells; e) calculating one or more decomposition boundaries in another predetermined order for the number of decomposition domains in the X direction and the number of decomposition domains in the Y direction, the predetermined number of decomposition domains being separated by the one or more decomposition boundaries calculated in the another predetermined order and assigned a respective another actual number of active cells; f) calculating another offset size based on the ideal number of active cells for each of the predetermined number of decomposition domains and the another actual number of active cells; g) repeating steps b)-f) for each combination calculated in step a), each combination represented by the offset size and the another offset size; and h) selecting one of the combinations with a lowest one of the offset size and the another offset size, the combination with the lowest one of the offset size and the another offset size including the decomposition boundaries calculated in the predetermined direction or the another predetermined direction.

In yet another embodiment, the present invention includes a non-transitory program carrier device tangibly carrying computer executable instructions for 2D domain decomposition during parallel reservoir simulation. The instructions are executable to implement: a) calculating each combination for a predetermined number of decomposition domains in a reservoir model; b) identifying a number of decomposition domains in an X direction and a number of decomposition domains in a Y direction for one of the combinations; c) calculating one or more decomposition boundaries in a predetermined order for the number of decomposition domains in the X direction and the number of decomposition domains in the Y direction, the predetermined number of decomposition domains being separated by the one or more decomposition boundaries calculated in the predetermined order and assigned a respective actual number of active cells; d) calculating an offset size based on an ideal number of active cells for each of the predetermined number of decomposition domains and the actual number of active cells; e) calculating one or more decomposition boundaries in another predetermined order for the number of decomposition domains in the X direction and the number of decomposition domains in the Y direction, the predetermined number of decomposition domains being separated by the decomposition boundaries calculated in the another predetermined order and assigned a respective another actual number of active cells; f) calculating another offset size based on the ideal number of active cells for each of the predetermined number of decomposition domains and the another actual number of active cells; g) moving the one or more decomposition boundaries calculated in the predetermined order or the one or more decomposition boundaries calculated in the another predetermined order by stair-stepping to produce one or more new decomposition boundaries calculated in the predetermined order or one or more new decomposition boundaries calculated in the another predetermined order, the predetermined number of decomposition domains being separated by the one or more new decomposition boundaries calculated in the predetermined order or the one or more new decomposition boundaries calculated in the another predetermined order and assigned a respective new actual number of active cells or a respective another new actual number of active cells; h) calculating a final offset size based on the ideal number of active cells for each of the predetermined number of decomposition domains and the new actual number of active cells or the another new actual number of active cells; i) repeating steps (b)-(h) for each combination calculated in step (a), each combination represented by the final offset size; and j) selecting one of the combinations with a lowest final offset size, the combination with the lowest final offset size including the one or more new decomposition boundaries calculated in the predetermined direction or the one or more new decomposition boundaries calculated in the another predetermined direction.

Additional aspects, advantages, and embodiments of the invention will become apparent to those skilled in the art from the following description of the embodiments and related drawings.

BRIEF DESCRIPTION OF THE DRAWINGS

The patent or application file contains at least one drawing executed in color. Copies of this patent or patent application publication with color drawing(s) will be provided by the U.S. Patent and Trademark Office upon request and payment of the necessary fee.

The present invention is described below with references to the accompanying drawings in which like elements are referenced with like reference numerals, and in which:

FIG. 2 illustrates an exemplary reservoir model with 5,184 grid cells and dimensions NX=32 cells, NY=27 cells and NZ=6 cells.

FIG. 3A illustrates the number of active cells for a cross-section of the reservoir model in FIG. 2 at $X_1$.

FIG. 3B illustrates the number of active cells from the cross-section in FIG. 3A to another cross-section of the reservoir model in FIG. 2 at $X_2$.

FIG. 3C illustrates the number of active cells from the cross-section in FIG. 3A to another cross-section of the reservoir model in FIG. 2 at $X_{11}$.

DETAILED DESCRIPTION OF THE PREFERRED EMBODIMENTS

The subject matter of the present invention is described with specificity, however, the description itself is not intended to limit the scope of the invention. The subject matter thus, might also be embodied in other ways, to include different steps or combinations of steps similar to the ones described herein, in conjunction with other technologies. Moreover, although the term "step" may be used herein to describe different elements of methods employed, the term should not be interpreted as implying any particular order among or between various steps herein disclosed unless otherwise expressly limited by the description to a particular order. While the following description refers to the oil and gas industry, the systems and methods of the present invention are not limited thereto and may also be applied to other industries to achieve similar results.

Method Description

Figure 1A:
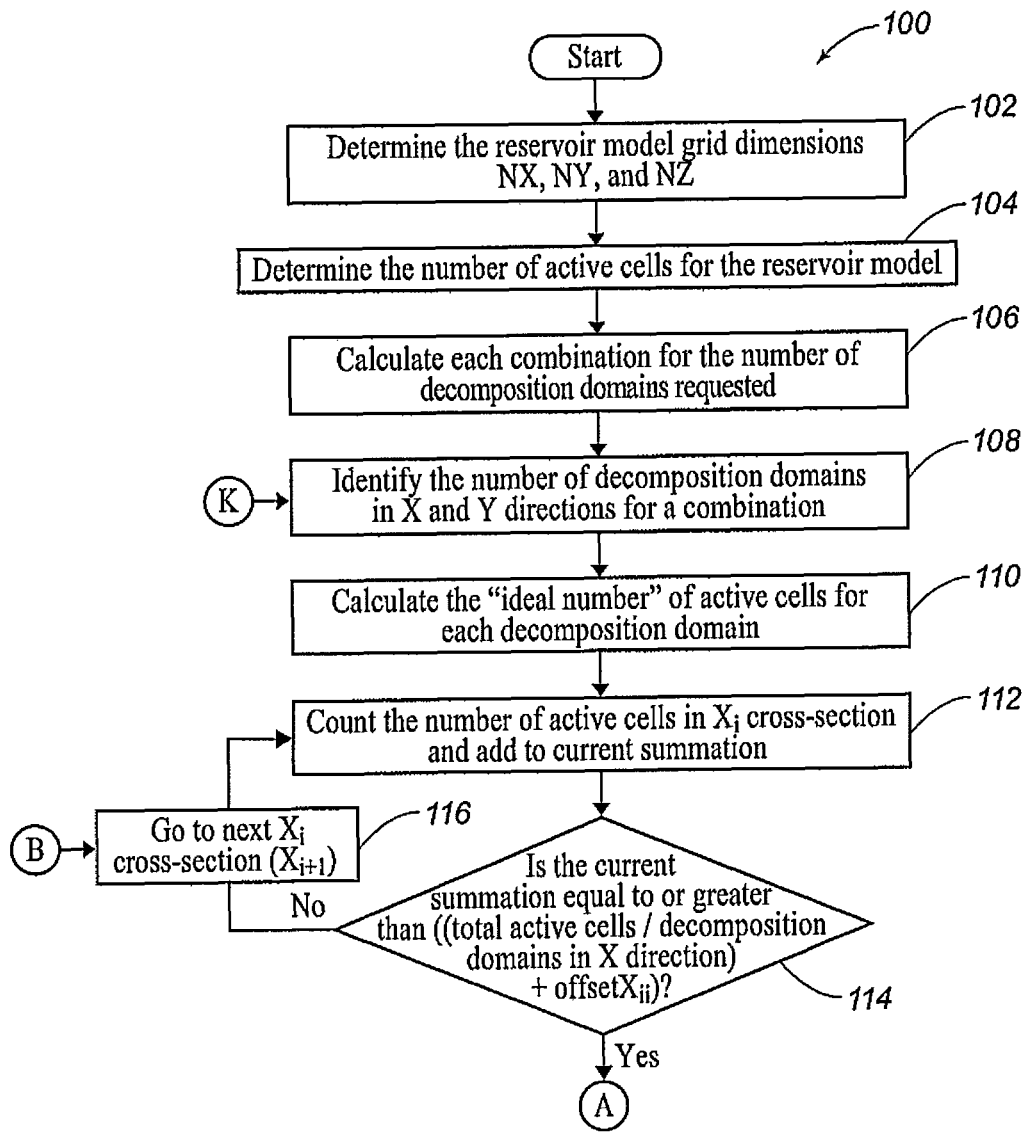
FIG. 1A is a flow diagram illustrating one embodiment of a method for implementing the present invention.
Figure 1B:
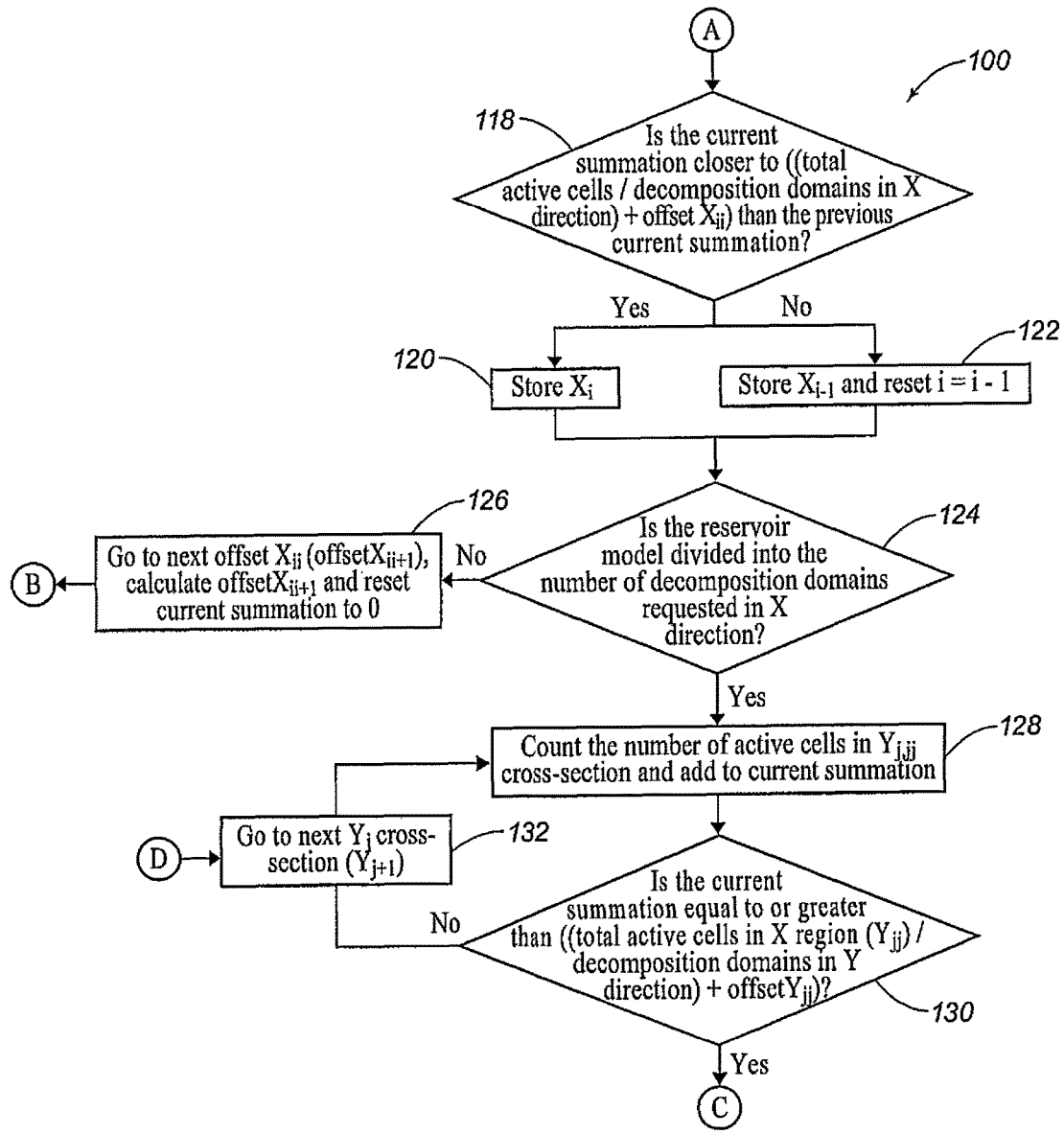
FIG. 1B is a continuation of the method illustrated in FIG. 1A.
Figure 1C:
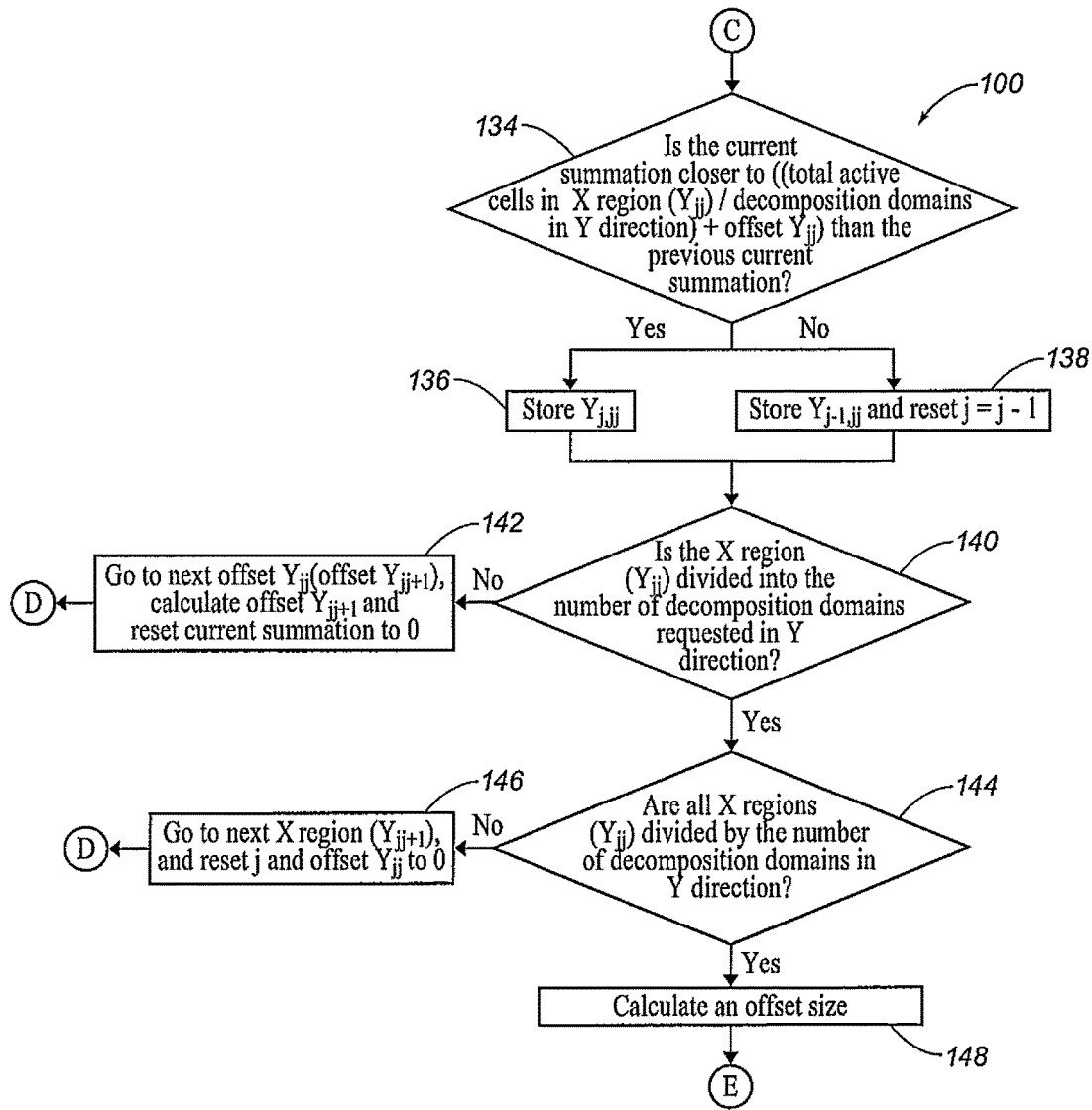
FIG. 1C is a continuation of the method illustrated in FIG. 1B.
Figure 1D:
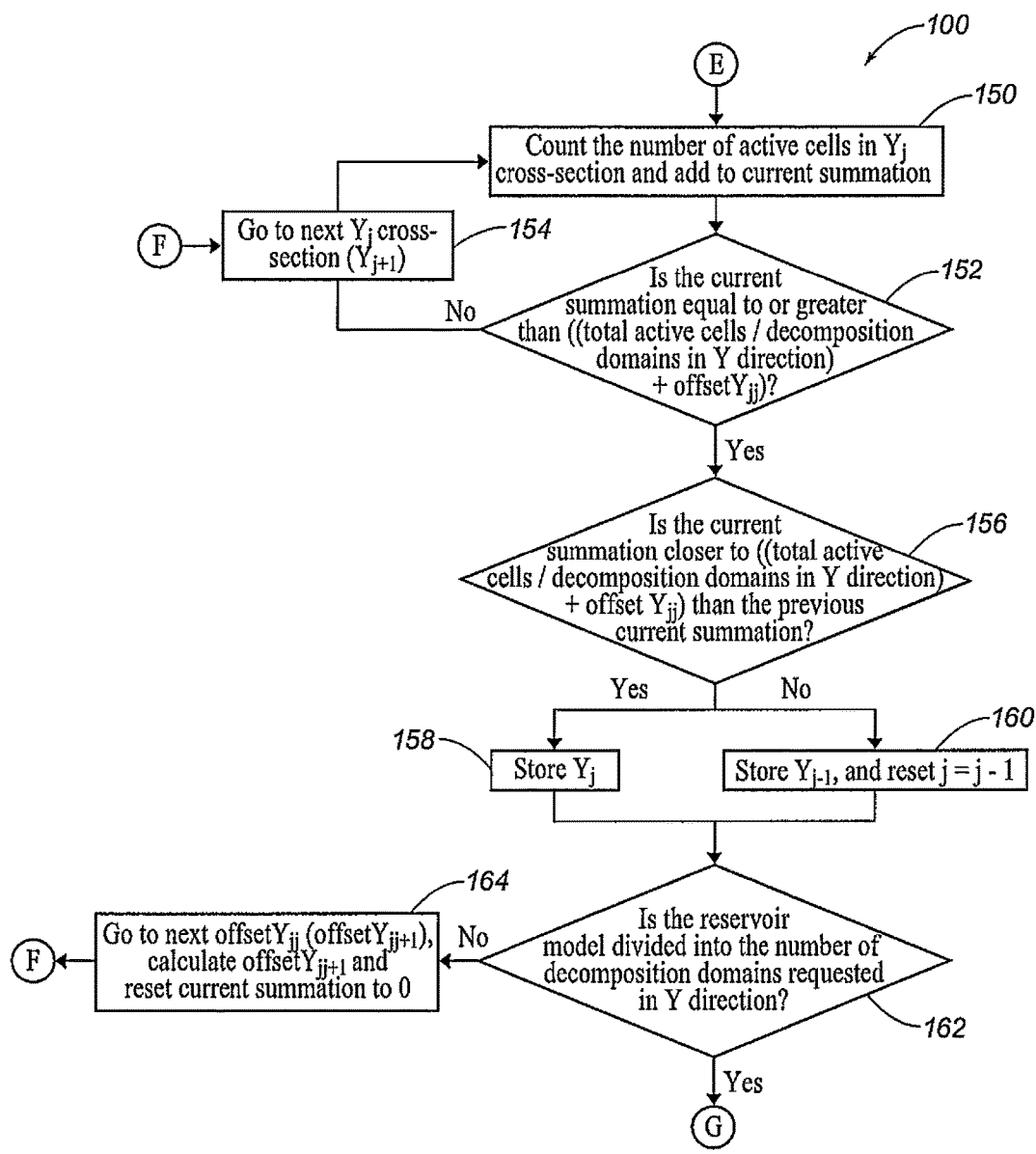
FIG. 1D is a continuation of the method illustrated in FIG. 1C.
Figure 1E:
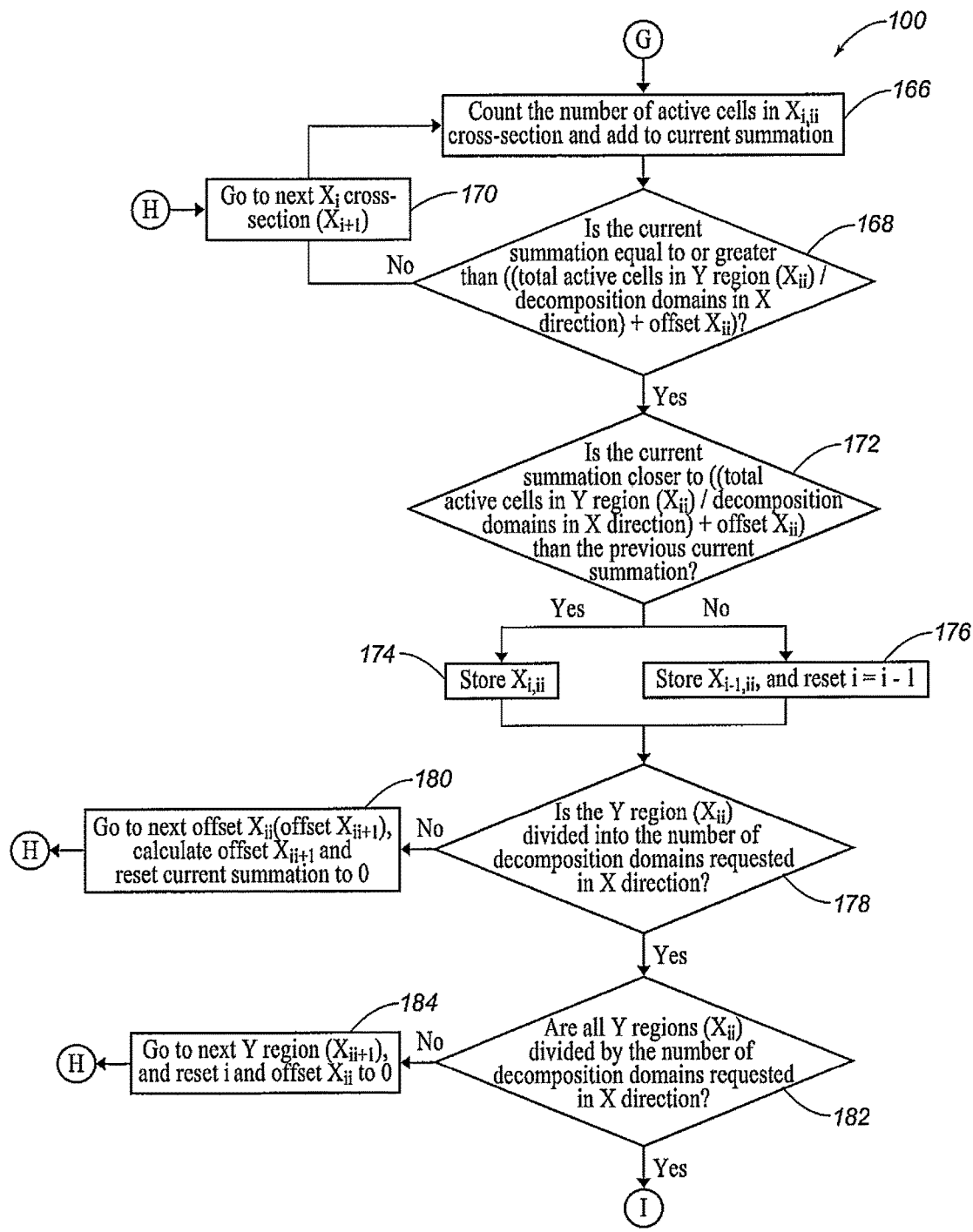
FIG. 1E is a continuation of the method illustrated in FIG. 1D.
Figure 1F:
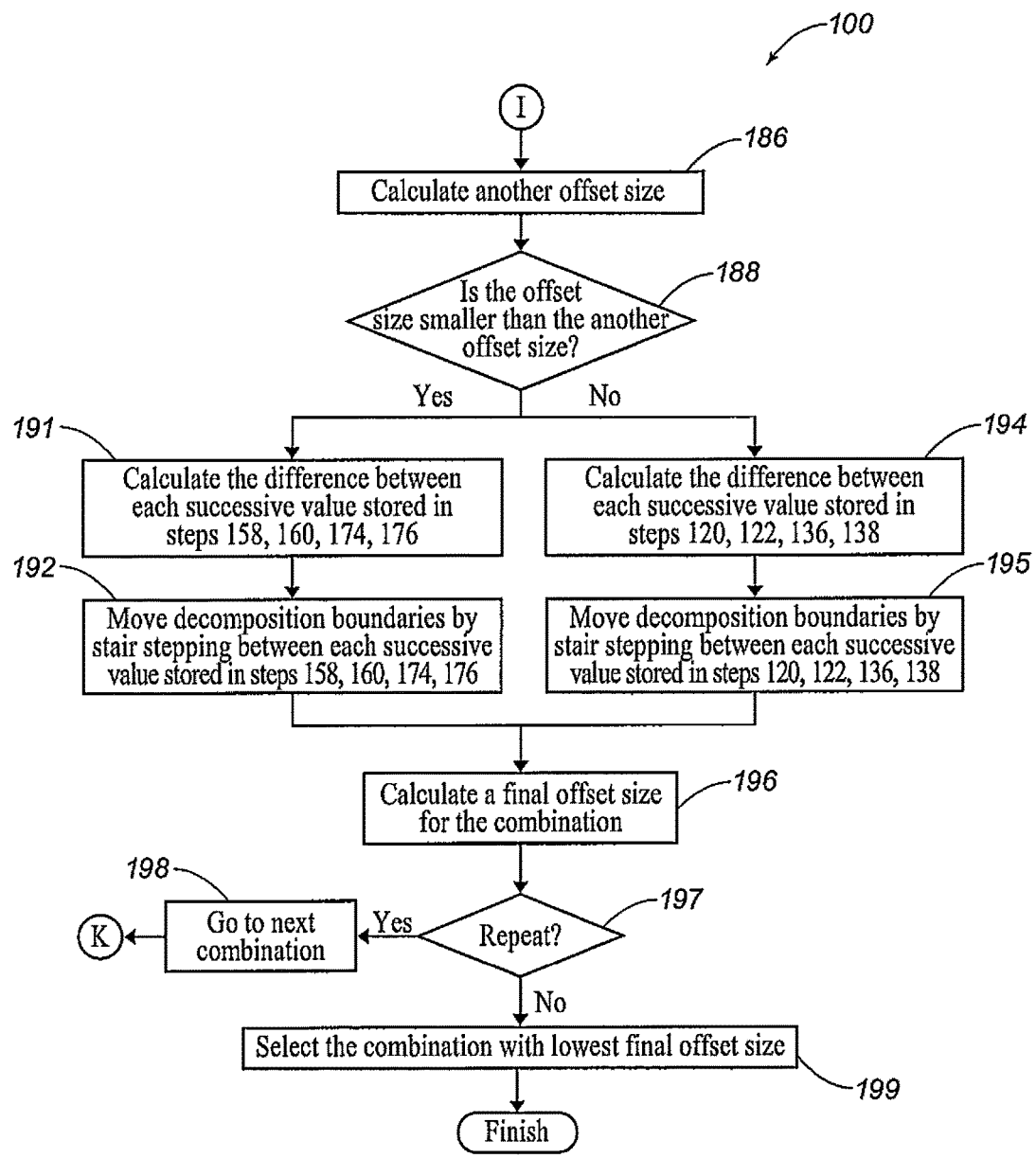
FIG. 1F is a continuation of the method illustrated in FIG. 1E.

Referring now to FIG. 1A, one embodiment of a method 100 for implementing the present invention is illustrated.

Figure 11:
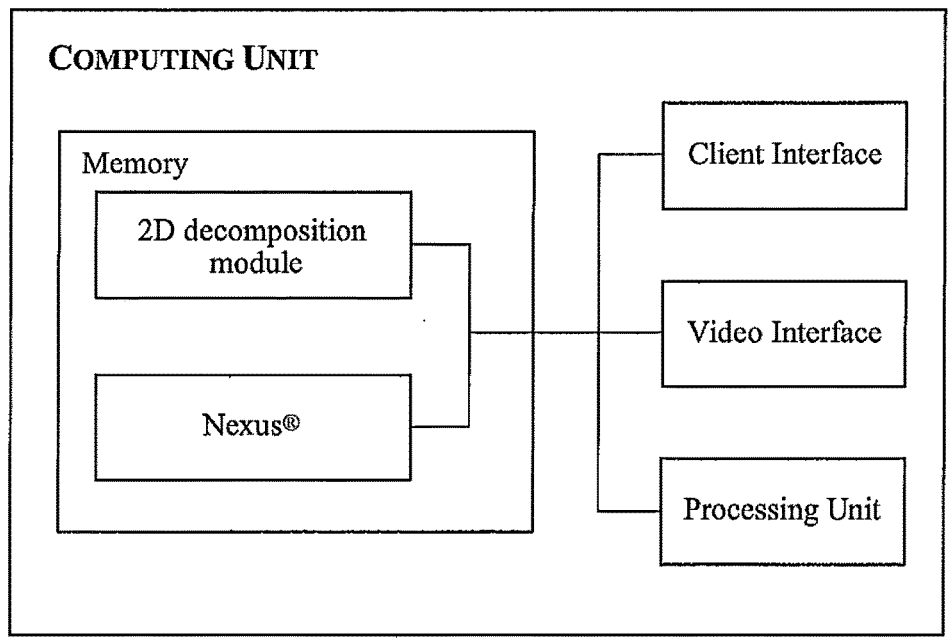
FIG. 11 is a block diagram illustrating one embodiment of a system for implementing the present invention.

In step 102, the reservoir model grid dimensions (NX, NY, NZ) are determined by input using the client interface and/or the video interface described in reference to FIG. 11. In FIG. 2, an exemplary reservoir model 200 is illustrated with dimensions NX=32 cells, NY=27 cells and NZ=6 cells for a total number of 5,184 cells.

In step 104, the total number of active cells for the reservoir model is determined by input using the client interface and/or the video interface described in reference to FIG. 11, and techniques well known in the art. Referring to the reservoir model 200 illustrated in FIG. 2, the total number of active cells is 4,970.

In step 106, each combination for the total number of decomposition domains requested is calculated using techniques well known in the art. Because parallel computing typically requires an even number of processors, the total number of decomposition domains requested will also be an even number in order that there may be one CPU assigned to each domain. The total number of decomposition domains requested also depends on how many CPU's may be utilized during parallel reservoir simulation. The number of decomposition domains requested are typically input for the X direction and the Y direction as requested using the client interface and/or the video interface described in reference to FIG. 11. The X and Y decomposition domain must each be greater than one. If, for example, the total number of decomposition domains is 32, the combinations for this number would be: 2×16, 4×18, 8×4 and 16×2. For consistency, the first number represents the X direction and the second number represents the Y direction.

In step 108, the number of decomposition domains in the X and Y directions for a combination from step 106 are identified using techniques well known in the art. For a 8×4 combination, the X direction would have 8 decomposition domains and the Y direction would have 4 decomposition domains.

In step 110, the ideal number of cells for each decomposition domain identified in step 108 are calculated by the following equation:

$$ideal_n = \frac{Total\_active\_cells}{number\_of\_domains} \quad (1)$$

Referring again to the reservoir model 200 illustrated in FIG. 2, the ideal number of cells for each decomposition domain in a 3×2 combination will be 828 active cells (total active cells (4,970)/number of domains (6)) in each of the six domains.

In step 112, the number of active cells in the $X_i$ cross-section are counted and added to the current summation. Here, i moves from 1 to NX. According to the reservoir model 200 illustrated in FIG. 2, there are 162 active cells in the first $X_i$ cross-section. This is more clearly illustrated in FIG. 3A, which represents the first $X_i$ cross-section of the reservoir model 200 where i=1. The current summation during the first iteration of step 112 is zero. In the example illustrated by FIG. 3A, the result would be 162 active cells in the first $X_i$ cross-section added to the current summation (0). The current summation therefore, becomes 162.

In step 114, the method 100 determines if the current summation (from step 112) is equal to or greater than ((total active cells/decomposition domains in X direction)+offset $X_{ii}$). If the current summation is equal to or greater than ((total active cells/decomposition domains in X direction)+offset $X_{ii}$), then the method 100 proceeds to step 118. If the current summation is not equal to or greater than ((total active cells/decomposition domains in X direction)+offset $X_{ii}$), then the method 100 proceeds to step 116. The offset $X_{ii}$ during the first iteration of step 114 is zero. And, ii moves from 1 to the number of decomposition domains requested in the X direction. In the example illustrated by FIG. 3A, the total active cells (4,970)/decomposition domains in X direction (3)+offset $X_{ii}$ (0)=1,656. The current summation from step 112 for this example (162) is therefore, not equal to or greater than 1,656.

In step 116, go to the next $X_i$ cross-section ($X_{i+1}$). The method 100 then returns to step 112 for another iteration. This is more clearly illustrated in FIG. 3B, which represents the next $X_i$ cross-section of the reservoir model 200 where i=2. In the example illustrated by FIG. 3B, the result of step 112 is 320. The current summation therefore, becomes 320. Because 320 is not equal to or greater than 1,656, the method 100 returns to step 116 for another iteration. The method 100 therefore, repeats steps 112, 114 and 116 until the current summation is equal to or greater than 1,656. In the example illustrated by FIG. 3C, which represents the $X_{11}$ cross-section of the reservoir model 200, the current summation (1,780) is equal to or greater than 1,656.

In step 118, the method 100 determines if the current summation (from step 112) is closer to ((total active cells/decomposition domains in X direction)+offset $X_{ii}$) than the previous current summation (from step 112). If the current summation is closer to ((total active cells/decomposition domains in X direction)+offset $X_{ii}$) than the previous current summation, then the method 100 proceeds to step 120. If the current summation is not closer to ((total active cells/decomposition domains in X direction)+offset $X_{ii}$) than the previous current summation, then the method 100 proceeds to step 122. In FIG. 3C, the current summation for $X_{11}$ is 1,780. The previous current summation (1,620) for $X_{10}$ is therefore, closer to 1,656 than the current summation (1,780). For this example, the method 100 would proceed to step 122.

In step 120, $X_i$ is stored.

In step 122, $X_{i-1}$ is stored and i is reset to i−$_1$. In FIG. 3C, $X_{i-1}$ where i=11 ($X_{(10)}$) would be stored and i is reset to 11−1=10.

In step 124, the method 100 determines if the reservoir model is divided into the number of decomposition domains requested in the X direction. If the reservoir model is divided into the number of decomposition domains requested in the X direction, then the method 100 proceeds to step 128. If the reservoir model is not divided into the number of decomposition domains requested in the X direction, then the method 100 proceeds to step 126. In the example illustrated by FIG. 3C, which is based on a 3×2 combination, there are three decomposition domains in the X direction. Therefore, applying step 124 to this example, the method 100 would proceed to step 126 because there are two more decomposition domains in the X direction.

Figure 4A:
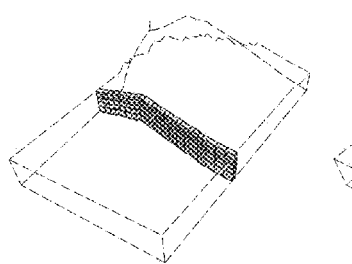
FIG. 4A illustrates the number of active cells for a cross-section of the reservoir model in FIG. 2 at $X_{11}$.
Figure 4B:
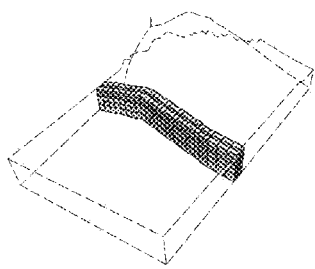
FIG. 4B illustrates the number of active cells from the cross-section in FIG. 4A to another cross-section of the reservoir model in FIG. 2 at $X_{12}$.
Figure 4C:
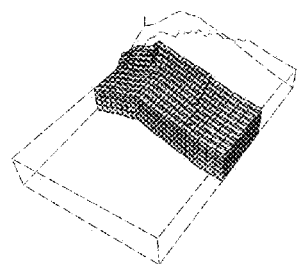
FIG. 4C illustrates the number of active cells from the cross-section in FIG. 4A to another cross-section of the reservoir model in FIG. 2 at $X_{21}$.

In step 126, go to next offset $X_{ii}$ (offset $X_{ii-1}$), calculate offset $X_{ii+1}$ and reset the current summation to zero. Because the offset $X_{ii}$ during the first iteration of step 114 is zero, the next offset $X_{ii}$ will be the difference between the number of active cells when $X_i$ or $X_{i-1}$ is stored in step 120 or step 122, respectively, and the total active cells/decomposition domains in the X direction. In FIG. 3C, $X_{i-1}$ ($X_{10}$) was stored in step 122. The previous current summation of active cells for $X_{10}$=1,620. The total active cells (4,970)/decomposition domains in the X direction (3)+offset $X_{ii}$(0)=1,656. The next offset $X_{ii}$ is therefore, calculated as the difference between 1,656-1,620=36 active cells. The method 100 then returns to step 116 for the next $X_i$ cross-section ($X_{i+1}$), which is $X_{11}$, and repeats from step 112. This is more clearly illustrated in FIGS. 4A, 4B and 4C, which represent the next $X_i$ cross-section of the reservoir model 200 at $X_{11}$, $X_{12}$ and $X_{21}$, respectively. The corresponding current summation (from step 112) for each respective $X_i$ cross-section is 159, 310 and 1,779. When the current summation reaches 1,779 at $X_{21}$, it is equal to or greater than the total active cells (4,970)/decomposition domains in X direction (6)+offset $X_{ii}$ (36)=1,692. Because the current summation (1,779) at $X_{21}$ is greater than or equal to 1,692 in step 114, the method 100 will proceed to step 118 in this example. Because the previous current summation (1,619) at $X_{20}$ is closer to 1,692 than the current summation (1,979) at $X_{21}$, the method 100 will proceed from step 118 to step 122 where it will store $X_{i-1}$ ($X_{20}$) and reset i=i-1. When the method 100 reaches step 124 in the example illustrated by FIG. 4C, the reservoir model is divided into the number of decomposition domains requested in the X direction (3). The remaining decomposition domain in the X direction is therefore, known to have 1,731 active cells=(total active cells (4,970)-current summation of active cells at $X_{10}$ (1,620)-current summation of active cells at $X_{20}$ (1,619)). The last decomposition domain requested in the X direction is therefore, defined from $X_{21}$ to NX, which is 32. This is the third decomposition domain in the X direction having 1,731 active cells.

Figure 5A:
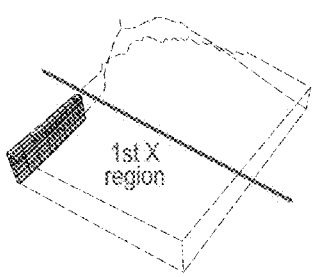
FIG. 5A illustrates the number of active cells for a cross-section in the first X decomposition domain (region) of the reservoir model in FIG. 2 at $Y_{1,1}$.

In step 128, the number of active cells in the $Y_{j,jj}$ cross-section are counted and added to the current summation. Here, j moves from 1 to NY and jj moves from 1 to the number of decomposition domains requested in the X direction. According to the reservoir model 200 illustrated in FIG. 2, there are 60 active cells in the first $Y_{j,jj}$ cross-section. This is more clearly illustrated in FIG. 5A, which represents the first $Y_{j,jj}$ cross-section of the reservoir model 200 where j=1 and jj=1. The current summation during the first iteration of step 128 is zero. In the example illustrated by FIG. 5A, the result would be 60 active cells in the first $Y_{j,jj}$ cross-section added to the current summation (0). The current summation therefore, becomes 60.

In step 130, the method 100 determines if the current summation (from step 128) is equal to or greater than ((total active cells in X region ($Y_{jj}$)/decomposition domains in Y direction)+offset $Y_{jj}$). If the current summation is equal to or greater than ((total active cells in X region ($Y_{jj}$)/decomposition domains in Y direction)+offset $Y_{jj}$), then the method 100 proceeds to step 134. If the current summation is not equal to or greater than ((total active cells in X region ($Y_{jj}$)/decomposition domains in Y direction)+offset $Y_{jj}$), then the method 100 proceeds to step 132. The offset $Y_{jj}$ during the first iteration of step 130 is zero. In the example illustrated by FIG. 5A, the total active cells in X region ($Y_{jj}$) (1,620)/decomposition domains in Y direction (2))+offset $Y_{jj}$ (0))=810. The current summation from step 128 for this example (60) is therefore, not equal to or greater than 810.

Figure 5B:
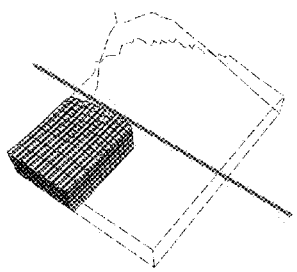
FIG. 5B illustrates the number of active cells from the cross-section in FIG. 5A to another cross-section of the reservoir model in FIG. 2 at $Y_{13,1}$

In step 132, go to the next $Y_j$ cross-section ($Y_{j+1}$). The method 100 then returns to step 128 for another iteration. This is more clearly illustrated in FIG. 5B, which represents the next $Y_j$ cross-section of the reservoir model 200 where j=13. In the example illustrated by FIG. 5B, the result of step 128 is 780. The current summation therefore, becomes 780. Because 780 is not equal to or greater than 810, the method 100 returns to step 132 for another iteration. The method 100 therefore, repeats steps 128, 130 and 132 until the current summation is equal to or greater than 810. In the example illustrated by FIG. 5C, which represents the $Y_{14}$ cross-section of the reservoir model 200, the current summation (839) is equal to or greater than 810.

Figure 5C:
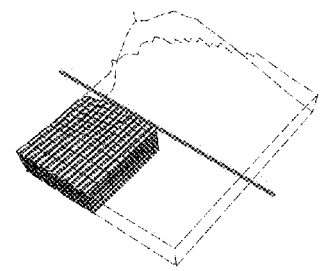
FIG. 5C illustrates the number of active cells from the cross-section in FIG. 5A to another cross-section of the reservoir model in FIG. 2 at $Y_{14,1}$

In step 134, the method 100 determines if the current summation (from step 128) is closer to ((total active cells in X region ($Y_{jj}$)/decomposition domains in Y direction)+offset $Y_{jj}$) than the previous current summation (from step 128). If the current summation is closer to ((total active cells in X region ($Y_{jj}$)/decomposition domains in Y direction)+offset $Y_{jj}$) than the previous current summation, then the method 100 proceeds to step 136. If the current summation is not closer to ((total active cells in X region ($Y_{jj}$)/decomposition domains in Y direction)+offset $Y_{jj}$) than the previous current summation, then the method 100 proceeds to step 138. In FIG. 5C, the current summation is 839 for $Y_{14}$. The previous current summation (780) for $Y_{13}$ is therefore, not closer to 810 than the current summation (839). For this example, the method 100 would proceed to step 136.

In step 136, $Y_{j,jj}$ is stored. In the example illustrated by FIG. 5C, $Y_{j,jj}$ where j=14 and jj=1 ($Y_{14,1}$) would be stored.

In step 138, $Y_{j-1,jj}$ is stored and j is reset to j-1.

In step 140, the method 100 determines if the X region ($Y_{jj}$) is divided into the number of decomposition domains requested in the Y direction. If the X region ($Y_{jj}$) is divided into the number of decomposition domains requested in the Y direction, then the method 100 proceeds to step 144. If the X region ($Y_{jj}$) is not divided into the number of decomposition domains requested in the Y direction, then the method 100 proceeds to step 142. In the example illustrated by FIG. 5C, which is based on a 3×2 combination, there are two decomposition domains in the Y direction. Therefore, applying step 140 to this example, the method 100 would proceed to step 144 because the first X region ($Y_{jj}$) is divided into the number of decomposition domains requested in the Y direction. The remaining decomposition domain in the Y direction is therefore, known to have 781 active cells=(total active cells in X region ($Y_{jj}$)(1,620)-current summation of active cells at $Y_{14}$ (839)). The last decomposition domain requested in the Y direction for the first X region (first decomposition domain in the X direction) is therefore, defined from $Y_{14}$ to NY, which is 27. This is the second decomposition domain in the Y direction for the first X region having 1,620 active cells.

In step 142, go to next offset $Y_{jj}$ (offset $Y_{jj+1}$), calculate offset $Y_{jj+1}$ and reset the current summation to 0. Because the offset $Y_{jj}$ during the first iteration of step 130 is zero, the next offset $Y_{jj}$ will be the difference between the number of active cells when $Y_{j,jj}$ or $Y_{j-1,jj}$ is stored in step 136 or step 138, respectively, and the total active cells in X region ($Y_{jj}$)/decomposition domains in Y direction. The method 100 then returns to step 132 for the next $Y_j$ cross-section ($Y_{j+1}$) and repeats from step 128.

In step 144, the method 100 determines if all X regions ($Y_{jj}$) are divided by the number of decomposition domains in the Y direction. If all X regions ($Y_{jj}$) are divided by the number of decomposition domains in the Y direction, then the method 100 proceeds to step 148. If all X regions ($Y_{jj}$) are not divided by the number of decomposition domains in the Y direction, then the method 100 proceeds to step 146. In the example illustrated by FIG. 5C, which is based on a 3×2 combination, there are two more decomposition domains (regions) in the X direction. Therefore, applying step 144 to this example, the method 100 would proceed to step 146 because not all X regions ($Y_{jj}$) are divided by the number of decomposition domains in the Y direction.

In step 146, go to the next X region ($Y_{jj+1}$), and reset j and offset $Y_{jj}$ to zero. The method 100 then returns to step 132 for the next $Y_j$ cross-section ($Y_{j+1}$) for the next X region ($Y_{jj+1}$) and repeats from step 128. In this manner, the method 100 iteratively repeats steps 128-144 until all X regions ($Y_{jj}$) are divided by the number of decomposition domains in the Y direction. This is more clearly illustrated by FIG. 6, which represents the reservoir model 200 divided into six (6) separately colored decomposition domains for a 3×2 combination. The reservoir model 200 illustrated in FIG. 6 was divided into six (6) decomposition domains according to steps 102-144 of the method 100 and includes $Y_{15}$ for the second decomposition domain in the X direction (2nd X region) and $Y_{16}$ for the third decomposition domain in the X direction (3rd X region).

Figure 6:
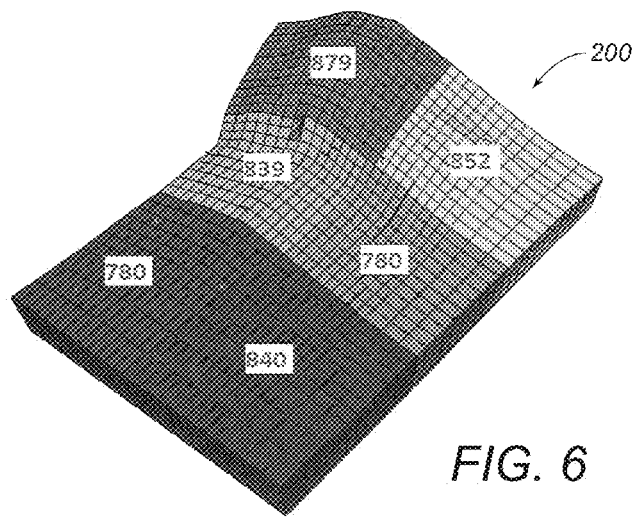
FIG. 6 illustrates the reservoir model in FIG. 2 and the actual number of active cells assigned to each colored decomposition domain according to steps 102-144 in FIGS. 1A-1C.

In step 148, an offset size is calculated by the following equation:

$$\text{offset\_size} = \sum_{i=1}^{n} \text{abs}(\text{ideal}_n - ac_i) \quad (2)$$

wherein (n) represents the total decomposition domains, $\text{ideal}_n$ represents the ideal number from equation (1) and ($ac_i$) represents the active cells that are assigned to each domain. For the reservoir model 200 illustrated in FIG. 6, the total number of active cells assigned to each separately colored decomposition domain is noted thereon. In this example, the ideal number is 828 according to equation (1)=total active cells (4,970)/number of domains (6). Therefore, the offset size for the reservoir model 200 illustrated in FIG. 6 is 194 according to equation (2).

Steps 150-186 are similar to steps 112-148, except that they are performed on the reservoir model in the reverse or opposite direction starting with the Y direction and moving to the X direction as demonstrated below.

In step 150, the number of active cells in $Y_j$ cross-section are counted and added to the current summation. Here, j moves from 1 to NY.

In step 152, the method 100 determines if the current summation (from step 150) is equal to or greater than ((total active cells/decomposition domains in Y direction)+offset $Y_{jj}$). If the current summation is equal to or greater than ((total active cells/decomposition domains in Y direction)+offset $Y_{jj}$), then the method 100 proceeds to step 156. If the current summation is not equal to or greater than ((total active cells/decomposition domains in Y direction)+offset $Y_{jj}$), then the method 100 proceeds to step 154. The offset $Y_{jj}$ during the first iteration of step 152 is zero. And, jj moves from 1 to the number of decomposition domains requested in the X direction.

In step 154, go to next Yi cross-section ($Y_{j+1}$). The method 100 then returns to step 150 for another iteration.

In step 156, the method 100 determines if the current summation (from step 150) is closer to ((total active cells/decomposition domains in Y direction)+offset $Y_{jj}$) than the previous current summation (from step 150). If the current summation is closer to ((total active cells/decomposition domains in Y direction)+offset $Y_{jj}$) than the previous current summation, then the method 100 proceeds to step 158. If the current summation is not closer to ((total active cells/decomposition domains in Y direction)+offset $Y_{jj}$) than the previous current summation, then the method 100 proceeds to step 160.

In step 158, $Y_j$ is stored.

In step 160, $Y_{j-1}$ is stored and j is reset to j-1.

In step 162, the method 100 determines if the reservoir model is divided into the number of decomposition domains requested in the Y direction. If the reservoir model is divided into the number of decomposition domains requested in the Y direction, then the method 100 proceeds to step 166. If the reservoir model is not divided into the number of decomposition domains requested in the Y direction, then the method 100 proceeds to step 164.

In step 164, to go next offset $Y_{jj}$ (offset $Y_{jj+1}$), calculate offset $Y_{jj+1}$ and reset the current summation to zero. Because the offset Y during the first iteration of step 152 is 0, the next offset $Y_{jj}$ will be the difference between the number of active cells when $Y_j$ or $Y_{j-1}$ is stored in step 158 or step 160, respectively, and the total active cells/decomposition domains in the Y direction. The method 100 then returns to step 154 for the next $Y_j$ cross-section ($Y_{j+1}$) and repeats from step 150.

In step 166, the number of active cells in $X_{i,ii}$ cross-section are counted and added to the current summation. Here, i moves from 1 to NX and ii moves from 1 to the number of decomposition domains requested in the X direction.

In step 168, the method 100 determines if the current summation (from step 166) is equal to or greater than ((total active cells in Y region ($X_{ii}$)/decomposition domains in X direction)+offset $X_{ii}$). If the current summation is equal to or greater than ((total active cells in Y region ($X_{ii}$)/decomposition domains in X direction)+offset $X_{ii}$) then the method 100 proceeds to step 172. If the current summation is not equal to or greater than ((total active cells in Y region ($X_{ii}$)/decomposition domains in X direction)+offset $X_{ii}$), then the method 100 proceeds to step 170.

In step 170, go to next $X_i$ cross-section ($X_{i+1}$). The method 100 then returns to step 166 for another iteration.

In step 172, the method determines if the current summation (from step 166) is closer to ((total active cells in Y region ($X_{ii}$)/decomposition domains in X direction)+offset $X_{ii}$) than the previous current summation (from step 166). If the current summation is closer to ((total active cells in Y region ($X_{ii}$)/decomposition domains in X direction)+offset $X_{ii}$), than the previous current summation, then the method 100 proceeds to step 174. If the current summation is not closer to ((total active cells in Y region ($X_{ii}$)/decomposition domains in X direction)+offset $X_{ii}$) than the previous current summation, then the method 100 proceeds to step 176.

In step 174, $X_{i,ii}$ is stored.

In step 176, $X_{i-1,ii}$ is stored and i is reset to i-1.

In step 178, the method 100 determines if the Y region ($X_{ii}$) is divided into the number decomposition domains requested in the X direction. If the Y region ($X_{ii}$) is divided into the number of decomposition domains requested in the X direction, then the method 100 proceeds to step 182. If the Y region ($X_{ii}$) is not divided into the number of decomposition domains requested in the X direction, then the method 100 proceeds to step 180.

In step 180, go to next offset Xii (offset Xii+1), calculate offset Xii+! and reset the current summation to 0. Because the offset Xii during the first iteration of step 168 is 0, the next offset Xii will be the difference between the number of active cells when Xi, ii or Xi–I, ii is stored in step 174 or step 176, respectively, and the total active cells in Y region (Xii) I decomposition domains in X direction. The method 100 then returns to step 170 for the next Xi cross-section (Xi+I) and repeats from step 166.

In step 182, the method 100 determines if all Y regions ($X_{ii}$) are divided by the number of decomposition domains requested in the X direction. If all Y regions ($X_{ii}$) are divided by the number of decomposition domains requested in the X direction, then the method 100 proceeds to step 186. If all Y regions ($X_{ii}$) are not divided by the number of decomposition domains requested in the X direction, then the method 100 proceeds to step 184.

In step 184, go to next Y region ($X_{ii+1}$), and reset i and offset $X_{ii}$ to zero. The method 100 then returns to step 170 for the next $X_i$ cross-section ($X_{i+1}$) for the next Y region ($X_{ii+1}$), and repeats from step 166. In this manner, the method 100 iteratively repeats steps 166-182 until all Y regions ($X_{ii}$) are divided by the number of decomposition domains in the X direction. This is more clearly illustrated by FIG. 7, which represents the reservoir model 200 divided into six (6) separately colored decomposition domains for a 3×2 combination. The reservoir model 200 illustrated in FIG. 7 was divided into six (6) decomposition domains according to steps 102-110 and steps 150-182 of the method 100.

Figure 7:
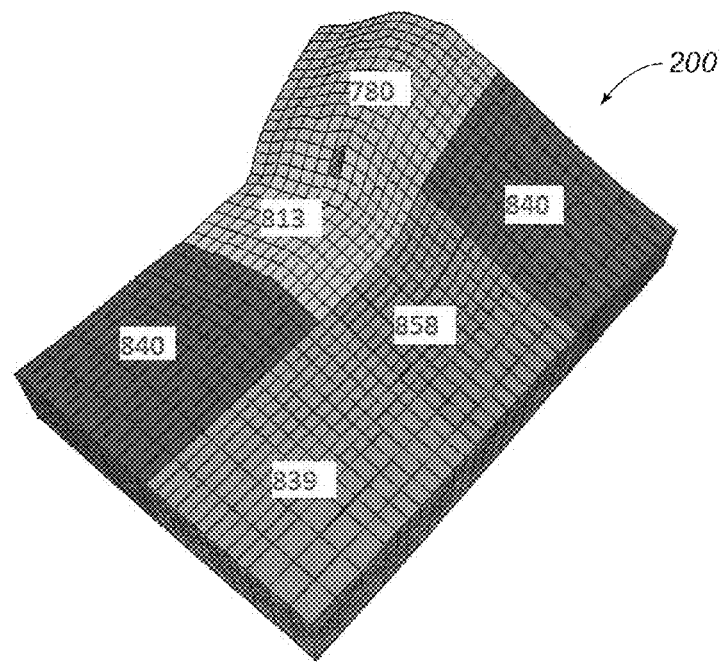
FIG. 7 illustrates the reservoir model in FIG. 2 and the actual number of active cells assigned to each colored decomposition domain according to steps 102-110 in FIG. 1A and steps 150-182 in FIGS. 1D-1E.

In step 186, another offset size is calculated using equation (2). For the reservoir model 200 illustrated in FIG. 7, the total number of active cells assigned to each separately colored decomposition domain is noted thereon. In this example, the ideal number is 828 according to equation (1). Therefore, the offset size for the reservoir model 200 illustrated in FIG. 7 is 128 according to equation (2).

In step 188, the method 100 determines if the offset size is smaller than the another offset size. If the offset size is smaller than the another offset size, then the method 100 proceeds to step 191. If the offset size is not smaller than the another offset size, then the method 100 proceeds to step 194. For the reservoir model 200 illustrated in FIG. 6, the offset size is 194. For the reservoir model 200 illustrated in FIG. 7, the another offset size is 128. Thus, the offset size is not smaller than the another offset size and the method 100 proceeds to step 194 for this example.

In step 191, the difference between each successive value stored in steps 158, 160, 174 and 176 is calculated.

In step 192, the decomposition boundaries are moved by stair stepping between each successive value stored in steps 158, 160, 174 and 176.

In step 194, the difference between each successive value stored in steps 120, 122, 136 and 138 is calculated.

Figure 8:
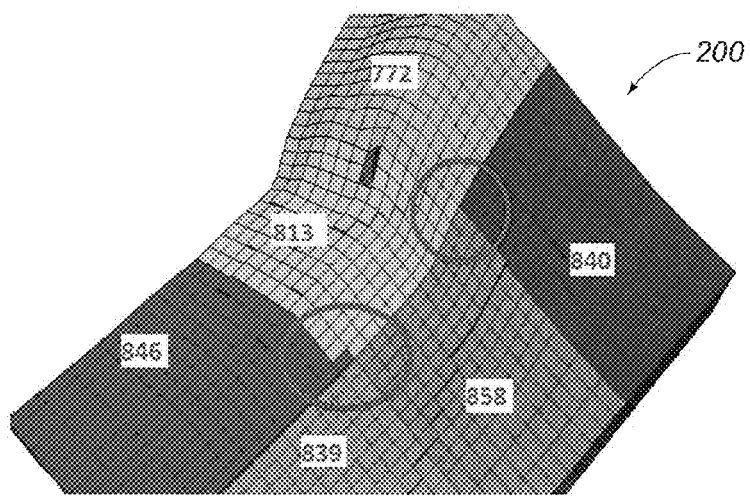
FIG. 8 illustrates the reservoir model in FIG. 2 and the actual number of active cells assigned to each colored decomposition domain after the decomposition boundaries illustrated in FIG. 7 are moved according to step 195 in FIG. 1F.
Figure 9A:
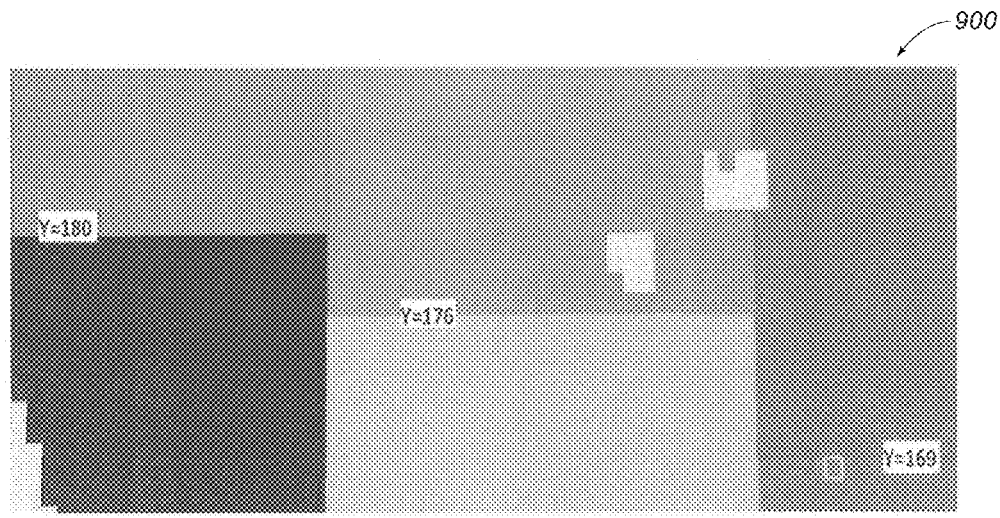
FIG. 9A illustrates another exemplary reservoir model and the decomposition boundaries between each colored decomposition domain.
Figure 9B:
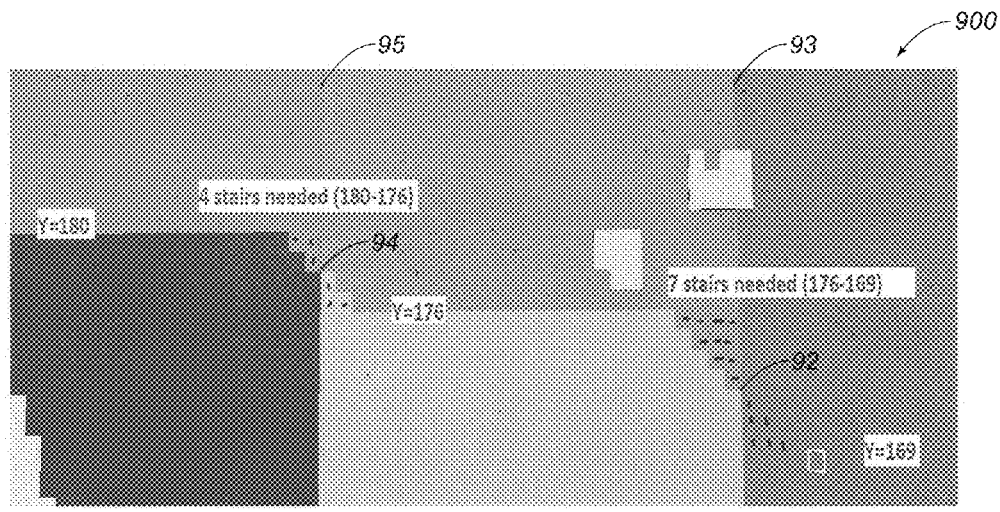
FIG. 9B illustrates the reservoir model in FIG. 9A after the decomposition boundaries are moved according to step 195 in FIG. 1F.

In step 195, the decomposition boundaries are moved by stair stepping between each successive value stored in steps 120, 122, 136 and 138. This step improves grid coloring when using parallel solvers and significantly improves parallel processing by moving the decomposition boundaries so that no two adjacent decomposition domains (i.e. domains having connections to each other) have the same color. Because the another offset size (128) was smaller than the offset size (194), the decomposition boundaries illustrated in FIG. 7 are moved by stair stepping between each successive value stored in steps 120, 122, 136 and 138. The result is illustrated in FIG. 8, which represents the reservoir model 200 divided into six (6) separately colored decomposition domains for a 3×2 combination. The total number of active cells assigned to each separately colored decomposition domain by this step is noted thereon. The areas circled in red illustrate where the stair stepping occurs when compared to FIG. 7. This may be more clearly illustrated by comparing FIG. 9A and FIG. 9B, which represent another reservoir model 900. In FIG. 9A, step 194 is performed and the results are used in step 195. Because there is no difference between each successive value stored in steps 120, 122, the only result for step 194 is the difference between each successive value stored in steps 136, 138, which is the difference between Y=169, Y=176 and Y=180. As illustrated in FIG. 9B, seven (7) stairs are needed between Y=169 and Y=176. Accordingly, a midpoint 92 on the decomposition boundary 93 separating the successive values (Y=169 and Y=176) is used to incrementally adjust the decomposition boundary from the midpoint 92 to the decomposition boundary represented by Y=169 and from the midpoint 92 to the decomposition boundary represented by Y=176. The incremental adjustment occurs on a cell by cell basis. The same adjustment is made for the difference between Y=176 and Y=180 from another midpoint 94. The cells with blue dots are therefore, assigned to different domains after stair stepping. This technique is referred to as stair stepping because the incremental adjustment of the domain boundaries on a cell by cell basis resembles stairs between the successive values for Y as illustrated in FIG. 9B.

In step 196, a final offset size is calculated for the combination using equation (2). For the reservoir model 200 illustrated in FIG. 8, the final offset size is 140 according to equation (2).

In step 197, the method 100 determines whether to repeat by identifying whether there is another combination calculated in step 106. If there is another combination calculated in step 106, then the method 100 proceeds to step 198. If there is not another combination calculated in step 106, then the method 100 proceeds to step 199.

In step 198, go to the next combination calculated in step 106. The method 100 then repeats from step 108 for the next combination and stops repeating at step 197 when there are no other combinations.

In step 199, the combination with the lowest final offset size calculated in step 196 is selected as the combination with decomposition boundaries representing the most balanced active cells.

Figure 10:
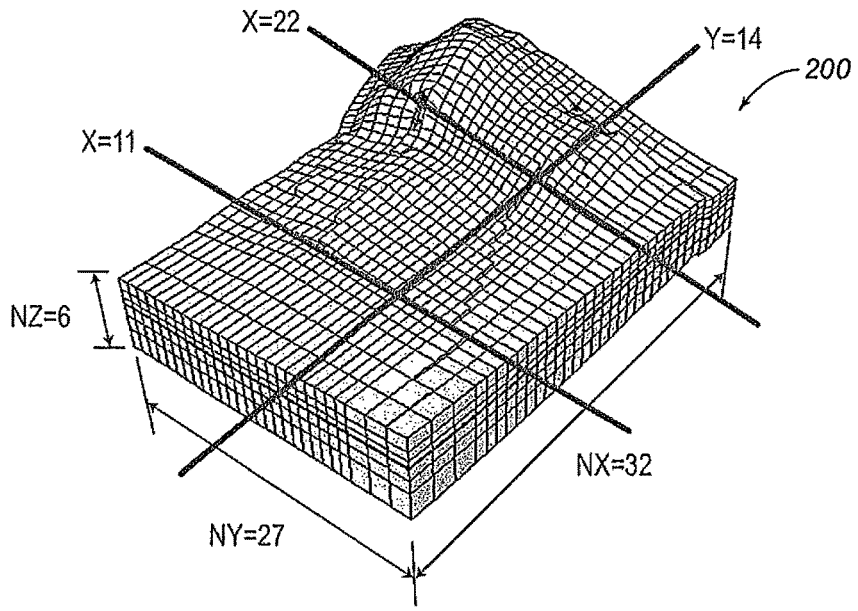
FIG. 10 illustrates the reservoir model in FIG. 2 divided into six (6) decomposition domains by a conventional 2D decomposition algorithm.

Referring now to FIG. 10, the reservoir model 200 is illustrated with different decomposition boundaries determined by a conventional 2D decomposition algorithm. In this example of a 3×2 decomposition, there are six (6) decomposition domains: three domains in the X direction and two domains in the Y direction. The offset size is 406 and illustrates the disproportionate assignment of active cells to each domain because the conventional 2D decomposition algorithm does not take the active cells into account. The offset size using the new method 100, which is optimally 128 for the reservoir model 200 illustrated in FIG. 7, represents a much more balanced assignment of the active cells to each domain than current methods.

EXAMPLES

To illustrate the advantages of the new method 100 over current methods, four models are addressed in the tables below. Table 1 provides the specifications/parameters for each model and Table 2 compares the performance of a current method and the new method 100 for each model.

TABLE 1

| Asset Name | # of cells | # of active cells | Decomposition |
|---|---|---|---|
| Model 1 | 543900 | 33680 | 2 × 3 × 1 |
| Model 2 | 385120 | 104138 | 2 × 3 × 1 |
| Model 3 | 576576 | 103760 | 2 × 3 × 1 |
| Model 4 | 597816 | 112291 | 2 × 3 × 1 |

TABLE 2

| Method | Active cells per domain | | | | | | ideal dec. | offset size | CPU time (s) | Improvement |
|---|---|---|---|---|---|---|---|---|---|---|
| | 1 | 2 | 3 | 4 | 5 | 6 | | | | |
| | | | Model 1 | | | | 5613 | | | % |
| Current | 3358 | 2324 | 11003 | 5029 | 5152 | 6614 | | 12780 | 343.9 | |
| New | 5655 | 5904 | 5277 | 5310 | 5673 | 5861 | | 1280 | 232.3 | 32.5 |
| | | | Model 2 | | | | 17356 | | | |
| Current | 25846 | 30 | 35680 | 4771 | 25205 | 12606 | | 69324 | 1512 | |
| New | 17838 | 16982 | 16490 | 17192 | 18215 | 17421 | | 2810 | 1066.6 | 29.5 |
| | | | Model 3 | | | | 17293 | | | |
| Current | 1937 | 13089 | 29370 | 29488 | 9636 | 20240 | | 54436 | 10683.6 | |
| New | 16571 | 18067 | 17507 | 17678 | 16773 | 17164 | | 2744 | 5419.9 | 49.3 |
| | | | Model 4 | | | | 18715 | | | |
| Current | 30506 | 551 | 32929 | 16207 | 23491 | 8607 | | 61561 | 8382.5 | |
| New | 21287 | 15264 | 18115 | 14092 | 24324 | 19209 | | 17349 | 6149 | 26.6 |

System Description

The present invention may be implemented through a computer-executable program of instructions, such as program modules, generally referred to as software applications or application programs executed by a computer. The software may include, for example, routines, programs, objects, components, and data structures that perform particular tasks or implement particular abstract data types. The software forms an interface to allow a computer to react according to a source of input. Nexus® may be used to interface with the present invention. The software may also cooperate with other code segments to initiate a variety of tasks in response to data received in conjunction with the source of the received data. The software may be stored and/or carried on any variety of memory media such as CD-ROM, magnetic disk, bubble memory and semiconductor memory (e.g., various types of RAM or ROM). Furthermore, the software and its results may be transmitted over a variety of carrier media such as optical fiber, metallic wire and/or through any of a variety of networks such as the Internet.

Moreover, those skilled in the art will appreciate that the invention may be practiced with a variety of computer-system configurations, including hand-held devices, multi-processor systems, microprocessor-based or programmable-consumer electronics, minicomputers, mainframe computers, and the like. Any number of computer-systems and computer networks are acceptable for use with the present invention. The invention may be practiced in distributed-computing environments where tasks are performed by remote-processing devices that are linked through a communications network. In a distributed-computing environment, program modules may be located in both local and remote computer-storage media including memory storage devices. The present invention may therefore, be implemented in connection with various hardware, software or a combination thereof, in a computer system or other processing system.

Referring now to FIG. 11, a block diagram illustrates one embodiment of a system for implementing the present invention on a computer. The system includes a computing unit, sometimes referred to a computing system, which contains memory, application programs, a client interface, a video interface and a processing unit. The computing unit is only one example of a suitable computing environment and is not intended to suggest any limitation as to the scope of use or functionality of the invention.

The memory primarily stores the application programs, which may also be described as program modules containing computer-executable instructions, executed by the computing unit for implementing the present invention described herein and illustrated in FIGS. 1-9. The memory therefore, includes a 2D decomposition module, which enables the method illustrated and described in reference to FIGS. 1A-1F. Although Nexus® may be used to utilize the results of the 2D decomposition module, other interface applications may be used instead of Nexus® or the 2D decomposition module may be used as a stand-alone application.

Although the computing unit is shown as having a generalized memory, the computing unit typically includes a variety of computer readable media. By way of example, and not limitation, computer readable media may comprise computer storage media. The computing system memory may include computer storage media in the form of volatile and/or nonvolatile memory such as a read only memory (ROM) and random access memory (RAM). A basic input/output system (BIOS), containing the basic routines that help to transfer information between elements within the computing unit, such as during start-up, is typically stored in ROM. The RAM typically contains data and/or program modules that are immediately accessible to and/or presently being operated on by the processing unit. By way of example, and not limitation, the computing unit includes an operating system, application programs, other program modules, and program data.

The components shown in the memory may also be included in other removable/non-removable, volatile/non-volatile computer storage media or they may be implemented in the computing unit through application program interface ("API"), which may reside on a separate computing unit connected through a computer system or network. For example only, a hard disk drive may read from or write to non-removable, nonvolatile magnetic media, a magnetic disk drive may read from or write to a removable, nonvolatile magnetic disk, and an optical disk drive may read from or write to a removable, nonvolatile optical disk such as a CD ROM or other optical media. Other removable/non-removable, volatile/non-volatile computer storage media that can be used in the exemplary operating environment may include, but are not limited to, magnetic tape cassettes, flash memory cards, digital versatile disks, digital video tape, solid state RAM, solid state ROM, and the like. The drives and their associated computer storage media discussed above provide storage of computer readable instructions, data structures, program modules and other data for the computing unit.

A client may enter commands and information into the computing unit through the client interface, which may be input devices such as a keyboard and pointing device, commonly referred to as a mouse, trackball or touch pad. Input devices may include a microphone, joystick, satellite dish, scanner, or the like. These and other input devices are often connected to the processing unit through a system bus, but may be connected by other interface and bus structures, such as a parallel port or a universal serial bus (USB).

A monitor or other type of display device may be connected to the system bus via an interface, such as a video interface. A graphical user interface ("GUI") may also be used with the video interface to receive instructions from the client interface and transmit instructions to the processing unit. In addition to the monitor, computers may also include other peripheral output devices such as speakers and printer, which may be connected through an output peripheral interface.

Although many other internal components of the computing unit are not shown, those of ordinary skill in the art will appreciate that such components and their interconnection are well known.

While the present invention has been described in connection with presently preferred embodiments, it will be understood by those skilled in the art that it is not intended to limit the invention to those embodiments. It is therefore, contemplated that various alternative embodiments and modifications may be made to the disclosed embodiments without departing from the spirit and scope of the invention defined by the appended claims and equivalents thereof.

The invention claimed is:

1. A computer-implemented method for two-dimensional (2D) domain decomposition during parallel reservoir simulation, comprising:

identifying a predetermined number of decomposition domains in a reservoir model using a computer processor;

calculating a plurality of configurations for the predetermined number of decomposition domains, each configuration of the plurality of configurations corresponding to one or more decomposition domains in an X direction and another one or more decomposition domains in a Y direction, and a total number of decomposition domains in each configuration equaling the predetermined number;

performing a process for each configuration of the plurality of configurations, the process being based on the predetermined number of decomposition domains, and the process including:

identifying a configuration of the plurality of configurations;

identifying a number of decomposition domains in the X direction and a number of decomposition domains in the Y direction for the configuration;

calculating one or more first decomposition boundaries for the number of decomposition domains in the X direction and the number of decomposition domains in the Y direction, a first number of active cells within each of the one or more first decomposition boundaries being determined by summing a number of active cells counted within each of one or more cross sections in the X direction, the one or more first decomposition boundaries being formed when the first number of active cells exceeds a pre-defined threshold number of active cells, such that the first number of active cells exceeding the pre-defined threshold number causes a new first decomposition boundary to begin, and the predetermined number of decomposition domains being separated by the one or more first decomposition boundaries and assigned a respective actual number of active cells;

calculating an offset size by computing a difference between the pre-defined threshold number of active cells and the actual number of active cells within each decomposition domain;

calculating one or more second decomposition boundaries for the number of decomposition domains in the X direction and the number of decomposition domains in the Y direction, a second number of active cells within the one or more second decomposition boundaries being determined by summing a number of active cells counted within each of one or more cross sections in the Y direction, the one or more second decomposition boundaries being formed when the second number of active cells exceeds the pre-defined threshold number of active cells, such that the second number of active cells exceeding the pre-defined threshold number causes a new second decomposition boundary to begin, and the predetermined number of decomposition domains being separated by the one or more second decomposition boundaries and assigned a respective another actual number of active cells; and calculating another offset size by computing a difference between the pre-defined threshold number of active cells and the another actual number of active cells within each decomposition domain;

repeating the process for each remaining configuration of the plurality of configurations, each configuration corresponding to a calculated offset size and a calculated another offset size;

iteratively adjusting at least one of the first decomposition boundaries or the second decomposition boundaries by adding or removing one or more active cells, a number of the one or more active cells added or removed being based on the offset size and the another offset size, and the adjusting defining one or more new first decomposition boundaries or one or more new second decomposition boundaries;

reducing a process time of the computer processor during the parallel reservoir simulation by selecting one of the configurations from among the plurality of configurations, the selected configuration having a lowest one of the offset size and the another offset size, the selected configuration including the one or more new first decomposition boundaries or the one or more new second decomposition boundaries; and determining a balanced number of active cells to assign to each decomposition domain of the selected configuration, the selected configuration representing a greater balance of assigned active cells to each decomposition domain as compared to remaining configurations of the plurality of configurations.

2. The method of claim 1, further comprising determining grid dimensions for the reservoir model.

3. The method of claim 2, further comprising determining a total number of active cells for the reservoir model.

4. The method of claim 3, wherein the pre-defined threshold number of active cells for each of the predetermined number of decomposition domains is calculated by dividing the total number of active cells for the reservoir model by the predetermined number of decomposition domains.

5. The method of claim 1, wherein the offset size and the another offset size are calculated using an equation:

$$\text{offset\_size} = \sum_{i=1}^{n} \text{abs}(ideal_n - ac_i)$$

wherein (n) represents the total decomposition domains, $ideal_n$ represents the pre-defined threshold number and ($ac_i$) represents the active cells that are assigned to each domain.

6. A method for two-dimensional (2D) domain decomposition during parallel reservoir simulation, comprising:
identifying a predetermined number of decomposition domains in a reservoir model using a computer processor;
calculating a plurality of configurations for the predetermined number of decomposition domains, each configuration of the plurality of configurations corresponding to one or more decomposition domains in an X direction and another one or more decomposition domains in a Y direction, and a total number of decomposition domains in each configuration equaling the predetermined number;
performing a process for each configuration of the plurality of configurations, the process being based on the predetermined number of decomposition domains, and the process including:
identifying a configuration of the plurality of configurations;
identifying a number of decomposition domains in the X direction and a number of decomposition domains in the Y direction for the configuration;
calculating one or more first decomposition boundaries for the number of decomposition domains in the X direction and the number of decomposition domains in the Y direction, a first number of active cells within each of the one or more first decomposition boundaries being determined by summing a number of active cells counted within each of one or more cross sections in the X direction, the one or more first decomposition boundaries being formed when the first number of active cells exceeds a pre-defined threshold number of active cells, such that the first number of active cells exceeding the pre-defined threshold number causes a new first decomposition boundary to begin, and the predetermined number of decomposition domains being separated by the one or more first decomposition boundaries and assigned a respective actual number of active cells;
calculating an offset size by computing a difference between the pre-defined threshold number of active cells and the actual number of active cells within each decomposition domain;
calculating one or more second decomposition boundaries for the number of decomposition domains in the X direction and the number of decomposition domains in the Y direction, a second number of active cells within the one or more second decomposition boundaries being determined by summing a number of active cells counted within each of one or more cross sections in the Y direction, the one or more second decomposition boundaries being formed when the second number of active cells exceeds the pre-defined threshold number of active cells, such that the second number of active cells exceeding the pre-defined threshold number causes a new second decomposition boundary to begin, and the predetermined number of decomposition domains being separated by the one or more second decomposition boundaries and assigned a respective another actual number of active cells;
calculating another offset size by computing a difference between the pre-defined threshold number of active cells and the another actual number of active cells within each decomposition domain;
iteratively adjusting the one or more first decomposition boundaries or the one or more second decomposition boundaries by stair-stepping to remove or add one or more active cells, a number of the one or more active cells removed or added being based on the offset size or the another offset size, the adjustment producing one or more new first decomposition boundaries or one or more new second decomposition boundaries-, the predetermined number of decomposition domains being separated by the one or more new first decomposition boundaries or the one or more new second decomposition boundaries so that no two adjacent decomposition domains have a same identifier and assigned a respective new actual number of active cells or a respective another new actual number of active cells; and
calculating a final offset size based on the pre-defined threshold number of active cells for each of the predetermined number of decomposition domains and the new actual number of active cells or the another new actual number of active cells;
repeating the process for each remaining configuration of the plurality of configurations, each configuration being represented by the final offset size;
reducing a process time of the computer processor during the parallel reservoir simulation by selecting one of the configurations from among the plurality of configurations, the selecting configuration having a lowest final offset size, the selected configuration including the one or more new first decomposition boundaries or the one or more new second decomposition boundaries; and
determining a balanced number of active cells to assign to each decomposition domain of the selected configuration, the selected configuration representing a greater balance of assigned active cells to each decomposition domain as compared to remaining configurations of the plurality of configurations.

7. The method of claim 6, further comprising determining grid dimensions for the reservoir model.

8. The method of claim 7, further comprising determining a total number of active cells for the reservoir model.

9. The method of claim 8, wherein the pre-defined threshold number of active cells for each of the predetermined number of decomposition domains is calculated by dividing the total number of active cells for the reservoir model by the predetermined number of decomposition domains.

10. The method of claim 6, wherein the offset size, the another offset size and the final offset size are calculated using an equation:

$$\text{offset\_size} = \sum_{i=1}^{n} \text{abs}(ideal_n - ac_i)$$

wherein (n) represents the total decomposition domains, $ideal_n$ represents the pre-defined threshold number and ($ac_i$) represents the active cells that are assigned to each domain.

11. A non-transitory program carrier device tangibly carrying computer executable instructions for two-dimensional (2D) domain decomposition during parallel reservoir simulation, the instructions being executable to implement:
identifying a predetermined number of decomposition domains in a reservoir model using a computer processor;
calculating a plurality of configurations for the predetermined number of decomposition domains, each configuration of the plurality of configurations corresponding to one or more decomposition domains in an X direction and another one or more decomposition domains in a Y direction, and a total number of decomposition domains in each configuration equaling the predetermined number;
performing a process for each configuration of the plurality of configurations, the process being based on the predetermined number of decomposition domains, and the process including:
identifying a configuration of the plurality of configurations;
identifying a number of decomposition domains in the X direction and a number of decomposition domains in the Y direction for the configuration;
calculating one or more first decomposition boundaries for the number of decomposition domains in the X direction and the number of decomposition domains in the Y direction, a first number of active cells within each of the one or more first decomposition boundaries being determined by summing a number of active cells counted within each of one or more cross sections in the X direction, the one or more first decomposition boundaries being formed when the first number of active cells exceeds a pre-defined threshold number of active cells, such that the first number of active cells exceeding the pre-defined threshold number causes a new first decomposition boundary to begin, and the predetermined number of decomposition domains being separated by the one or more first decomposition boundaries and assigned a respective actual number of active cells;
calculating an offset size by computing a difference between the pre-defined threshold number of active cells and the actual number of active cells within each decomposition domain;
calculating one or more second decomposition boundaries for the number of decomposition domains in the X direction and the number of decomposition domains in the Y direction, a second number of active cells within the one or more second decomposition boundaries being determined by summing a number of active cells counted within each of one or more cross sections in the Y direction, the one or more second decomposition boundaries being formed when the second number of active cells exceeds the pre-defined threshold number of active cells, such that the second number of active cells exceeding the pre-defined threshold number causes a new second decomposition boundary to begin, and the predetermined number of decomposition domains being separated by the one or more second decomposition boundaries and assigned a respective another actual number of active cells; and
calculating another offset size by computing a difference between the pre-defined threshold number of active cells and the another actual number of active cells within each decomposition domain;
repeating the process for each remaining configuration of the plurality of configurations, each configuration corresponding to a calculated offset size and a calculated another offset size;
iteratively adjusting at least one of the first decomposition boundaries or the second decomposition boundaries by adding or removing one or more active cells, a number of active cells added or removed being based on offset size and the another offset size, and the adjusting defining one or more new first decomposition boundaries or one or more new second decomposition boundaries;
reducing a process time of the computer processor during the parallel reservoir simulation by selecting one of the configurations from the plurality of configurations, the selected configuration having a lowest one of the offset size and the another offset size, the selected configuration including the one or more new first decomposition boundaries or the one or more new second decomposition boundaries; and
determining a balanced number of active cells to assign to each decomposition domain of the selected configuration, the selected configuration representing a greater balance of assigned active cells to each decomposition domain as compared to remaining configurations of the plurality of configurations.

12. The program carrier device of claim 11, further comprising determining grid dimensions for the reservoir model.

13. The program carrier device of claim 12, further comprising determining a total number of active cells for the reservoir model.

14. The program carrier device of claim 13, wherein the pre-defined threshold number of active cells for each of the predetermined number of decomposition domains is calculated by dividing the total number of active cells for the reservoir model by the predetermined number of decomposition domains.

15. The program carrier device of claim 11, wherein the offset size and the another offset size are calculated using an equation:

$$\text{offset\_size} = \sum_{i=1}^{n} \text{abs}(ideal_n - ac_i)$$

wherein (n) represents the total decomposition domains, $ideal_n$ represents the pre-defined threshold number and ($ac_i$) represents the active cells that are assigned to each domain.

16. A non-transitory program carrier device tangibly carrying computer executable instructions for two-dimensional (2D) domain decomposition during parallel reservoir simulation, the instructions being executable to implement:

identifying a predetermined number of decomposition domains in a reservoir model using a computer processor;

calculating a plurality of configurations for the predetermined number of decomposition domains, each configuration of the plurality of configurations corresponding to one or more decomposition domains in an X direction and another one or more decomposition domains in a Y direction, and a total number of decomposition domains in each configuration equaling the predetermined number;

performing a process for each configuration of the plurality of configurations, the process being based on the predetermined number of decomposition domains, and the process including:

identifying a configuration of the plurality of configurations;

identifying a number of decomposition domains in the X direction and a number of decomposition domains in the Y direction for the configuration;

calculating one or more first decomposition boundaries for the number of decomposition domains in the X direction and the number of decomposition domains in the Y direction, a first number of active cells within each of the one or more first decomposition boundaries being determined by summing a number of active cells counted within each of one or more cross sections in the X direction, the one or more first decomposition boundaries being formed when the first number of active cells exceeds a pre-defined threshold number of active cells, such that the first number of active cells exceeding the pre-defined threshold number causes a new first decomposition boundary to begin, and the predetermined number of decomposition domains being separated by the one or more first decomposition boundaries and assigned a respective actual number of active cells;

calculating an offset size by computing a difference between the pre-defined threshold number of active cells and the actual number of active cells within each decomposition domain;

calculating one or more second decomposition boundaries for the number of decomposition domains in the X direction and the number of decomposition domains in the Y direction, a second number of active cells within the one or more second decomposition boundaries being determined by summing a number of active cells counted within each of one or more cross sections in the Y direction, the one or more second decomposition boundaries being formed when the second number of active cells exceeds the pre-defined threshold number of active cells, such that the second number of active cells exceeding the pre-defined threshold number causes a new second decomposition boundary to begin, and the predetermined number of decomposition domains being separated by the one or more second decomposition boundaries and assigned a respective another actual number of active cells;

calculating another offset size by computing a difference between the pre-defined threshold number of active cells and the another actual number of active cells within each decomposition domain;

iteratively adjusting the one or more first decomposition boundaries or the one or more second decomposition boundaries by stair-stepping to remove or add one or more active cells, a number of active cells removed or added being based on the offset size and the another offset size, the adjustment producing one or more new first decomposition boundaries or one or more new second decomposition boundaries, the predetermined number of decomposition domains being separated by the one or more new first decomposition boundaries or the one or more new second decomposition boundaries so that no two adjacent decomposition domains have a same identifier and assigned a respective new actual number of active cells or a respective another new actual number of active cells; and calculating a final offset size based on the pre-defined threshold number of active cells for each of the predetermined number of decomposition domains and the new actual number of active cells or the another new actual number of active cells;

repeating the process for each remaining configuration of the plurality of configurations, each configuration being represented by the final offset size; and reducing a process time of the computer processor during the parallel reservoir simulation by selecting one of the configurations from the plurality of configurations, the selected configuration having a lowest final offset size, the configuration with the lowest final offset size including the one or more new first decomposition boundaries or the one or more new second decomposition boundaries; and determining a balanced number of active cells to assign to each decomposition domain of the selected configuration, the selected configuration representing a greater balance of assigned active cells to each decomposition domain as compared to remaining configurations of the plurality of configurations.

17. The program carrier device of claim 16, further comprising determining grid dimensions for the reservoir model.

18. The program carrier device of claim 17, further comprising determining a total number of active cells for the reservoir model.

19. The program carrier device of claim 18, wherein the pre-defined threshold number of active cells for each of the predetermined number of decomposition domains is calculated by dividing the total number of active cells for the reservoir model by the predetermined number of decomposition domains.

20. The program carrier device of claim 16, wherein the offset size, the another offset size and the final offset size are calculated using an equation:

$$\text{offset\_size} = \sum_{i=1}^{n} \text{abs}(ideal_n - ac_i)$$

wherein (n) represents the total decomposition domains, $ideal_n$ represents the pre-defined threshold number and $(ac_i)$ represents the active cells that are assigned to each domain.

* * * * *